United States Patent [19]

Kasai et al.

[11] Patent Number: 5,028,003
[45] Date of Patent: Jul. 2, 1991

[54] HIGH PRESSURE FLUID PROCESSING DEVICE

[75] Inventors: Shin Kasai; Michio Sato, both of Fukushima, Japan

[73] Assignee: Nitto Boseki Co., Ltd., Fukushima, Japan

[21] Appl. No.: 80,225

[22] Filed: Jul. 29, 1987

Related U.S. Application Data

[63] Continuation of Ser. No. 543,010, Mar. 24, 1986, abandoned.

[30] Foreign Application Priority Data

Apr. 3, 1985 [JP] Japan .................................. 60-70337

[51] Int. Cl.$^5$ ............................. B05B 1/14; B05B 3/14
[52] U.S. Cl. ............................... 239/102.1; 239/225.1; 239/264
[58] Field of Search ..................... 239/225.1, 227, 264, 239/265, 102.1, 263.1, 263.3

[56] References Cited

U.S. PATENT DOCUMENTS

| 2,881,503 | 4/1959 | Johnson . |
| 4,231,239 | 11/1980 | Lazaroff ........................ 239/178 X |
| 4,600,149 | 7/1986 | Wakatsuki ........................ 239/264 |

FOREIGN PATENT DOCUMENTS

| 660580 | 5/1938 | Fed. Rep. of Germany . |
| 2462297 | 10/1976 | Fed. Rep. of Germany . |
| 3141516 | 5/1983 | Fed. Rep. of Germany . |
| 3233274 | 3/1984 | Fed. Rep. of Germany . |
| 2477436 | 9/1981 | France . |
| 2554366 | 5/1985 | France . |
| 634491 | 2/1983 | Switzerland . |
| 1497063 | 1/1978 | United Kingdom . |

Primary Examiner—Andres Kashnikow
Assistant Examiner—Christopher G. Trainor
Attorney, Agent, or Firm—Sixbey, Friedman, Leedom & Ferguson

[57] ABSTRACT

A high pressure fluid processing device is disclosed including a frame positioned across a passage for conveying workpieces, a header having a plurality of nozzles thereon arranged at intervals (P), a driving mechanism for moving the nozzles on circles with the radius (e), and the radius (e) and the nozzle interval (P) satisfying the equation:

$$e \geq P/2;$$

5 Claims, 3 Drawing Sheets

HIGH PRESSURE FLUID PROCESSING DEVICE

This application is a continuation of Ser. No. 843,010, filed Mar. 24, 1986, now abandoned.

DETAILED DESCRIPTION OF THE INVENTION

1. Field of the Invention

This invention relates to high pressure fluid processing devices, and more particularly to a high pressure fluid processing device which is suitable for jetting high pressure fluid streams onto plastic or ceramic molded articles or inorganic fiber woven cloth to remove burrs therefrom or clean them, or to subject the surface of inorganic fiber woven cloth to raising or the like.

2. Description of the Prior Art

A high pressure fluid machining device has been used to cut or drill non-metallic materials, stones, concrete blocks, etc. (cf. Japanese Patent Application Publication No. 22692/1982).

The high pressure fluid machining device has been extensively utilized because it is advantageous in that (1) the cutting tolerance is small, (2) less material is wasted, (3) no dust is formed during operation, and (4) no heat is produced during grinding or cutting.

The conventional high pressure fluid machining device is mainly used for cutting or drilling non-metallic materials, stones, concrete blocks, etc. as described above. That is, in the device, water is jetted from a nozzle 0.1 to 0.5 mm in diameter under an ultra-high pressure of about 5,000 kg/cm$^2$ to obtain the high speed fluid energy which is used for cutting or drilling inorganic materials. Therefore, the device is not always suitable for uniformly processing a wide article having a large surface area.

PROBLEM TO BE SOLVED BY THE INVENTION

An object of this invention is to provide a high pressure fluid processing device which is capable of uniformly processing a wide article having a large surface area.

MEANS FOR SOLVING THE PROBLEM

The foregoing object of the invention is achieved by the provision of a high pressure fluid processing device which, according to the invention, comprises a frame positioned across a passage for conveying workpieces to be processed thereby; a header having a plurality of nozzles which are arranged at intervals (P) in the transverse direction of workpieces to be processed, the header having coupling parts at both ends which are coupled to a driving means so that each of the coupling parts rotates with a radius (e), the plurality of nozzles being moved on circles with the radius (e) in accordance with the circular motion of the coupling parts of the header, and the radius (e) and the nozzle interval (P) satisfying the equation:

$$e \geq P/2$$

FUNCTION

The device of the invention is constructed as described above. The header is connected to a flexible hose, through which high pressure fluid is supplied to the header. The high pressure fluid thus supplied is jetted through a plurality of nozzles formed on the header.

Both ends of the header are rotatably coupled to rotatable shafts which are provided on the frame positioned across a passage for conveying workpieces to be processed. More specifically, the header is coupled, at one end, to a rotatable shaft so that it is driven to rotate with a radius (e) about the rotatable shaft, and the other end of the header is also rotated with the same radius (e) about the rotatable shaft.

As the two ends of the header rotate with the radius (e) as described above, each of the nozzles of the header is moved on a circle with the radius (e).

While a wide workpiece to be processed is advanced along the workpiece conveying path, the high pressure fluid is supplied into the header and the rotatable shaft is driven by the motor. Therefore, the high pressure fluid thus supplied is jetted through the nozzles, which are rotating with the radius (e), with respect to the wide workpiece.

PREFERRED EMBODIMENT OF THE INVENTION

The invention will be described with reference to drawings in detail.

Figure 3C:
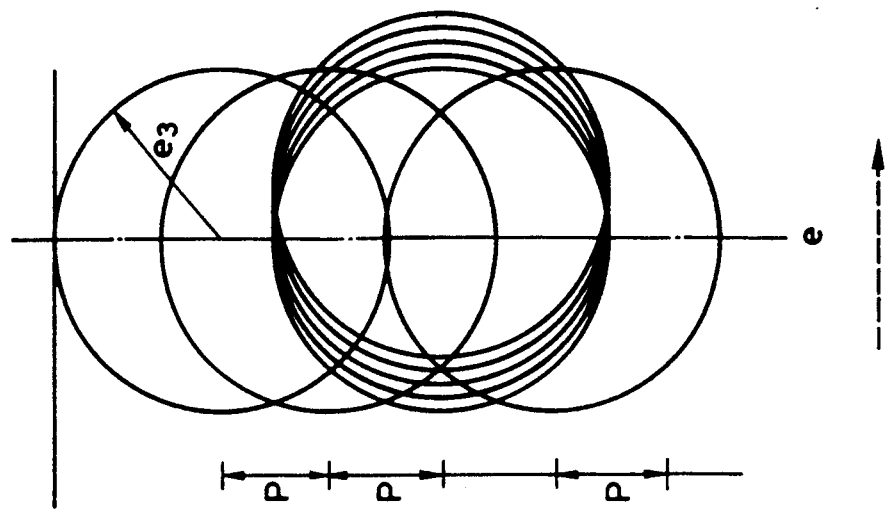
FIGS. 3(a), 3(b), and 3(c) are explanatory diagrams showing nozzle intervals with circular motion radii.
Figure 3B:
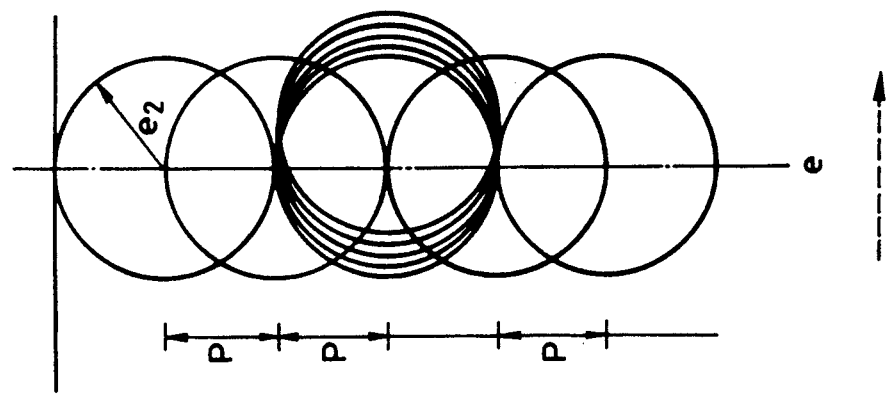
Figure 3A:
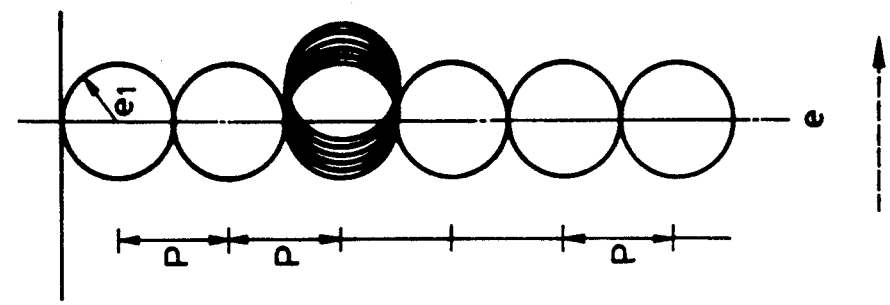

FIGS. 3(a) through 3(c) are explanatory diagrams showing nozzle intervals with circular motion radii. In FIG. 3(a), the radius is half ($\frac{1}{2}$) of the nozzle interval. In FIG. 3(b), the radius is equal to the nozzle interval. In FIG. 3(c), the radius is 1.5 times as large as the nozzle interval.

FIGS. 3(a), 3(b) and 3(c) show nozzle intervals (P) with nozzle circular motion radii (e) in the case where a workpiece to be processed is moved in the direction of the arrows indicated by dotted lines. In the case where the radius ($e_1$) of the circular motion is half ($\frac{1}{2}$) of the interval (P) of the nozzles ($e_1 = P/2$) as 20 shown in FIG. 3(a), theoretically the high pressure fluid streams jetted through the nozzles do not overlap one another, and the energy thereof is therefore uniformly applied to the surface of the workpiece.

In the case of FIG. 3(b), the interval (P) of the nozzles is equal to the radius ($e_2$) of the circular motion, and therefore the high pressure fluid streams jetted overlap one another although the overlapping of the streams is not caused at both side portions of the workpiece.

In the case of FIG. 3(c), the radius ($e_3$) of the circular motion is 1.5 times as large as the nozzle interval (P). In this case, the high pressure fluid streams jetted overlap one another twice or thrice. The above-described three modes can be selectively employed according to the degree of treatment to be given to the workpiece.

In general, in the high pressure fluid processing device, the nozzle interval (P) is set at 10 to 20 mm, each nozzle has a diameter of 0.1 to 0.5 mm, the circular motion radius (e) is in a range of 10 to 30 mm, and the process is performed at a speed of 100 to 3000 rpm. The nozzle interval (P) and the circular motion radius (e)

can be determined according to the configuration and the purpose of use of the workpiece, and the line speed. However, $e<P/2$ is not suitable because, in this case, the surface of the workpiece includes the regions where no high speed fluid stream is applied. If the circular motion radius (e) of the nozzle is excessively larger than the nozzle interval (P), an excessively large load is applied to the device during high speed rotation, thus reducing the durability of the device and its components. Accordingly, it is preferable that the nozzle interval (P) and the circular motion radius (e) satisfy $e \geq P/2$, more preferably $5P \geq e \geq P/2$.

In the invention, the high pressure fluid jet pressure may be in the range of 50 kg/cm² to 3000 kg/cm² according to the configuration, the material and the purpose of use of a workpiece to be processed, or the line speed. Accordingly, the device of the invention has a wide range of application; for instance, it can be used for removing burrs from plastic moldings or cleaning them, or treating the surface of inorganic fiber woven cloth.

Figure 1:
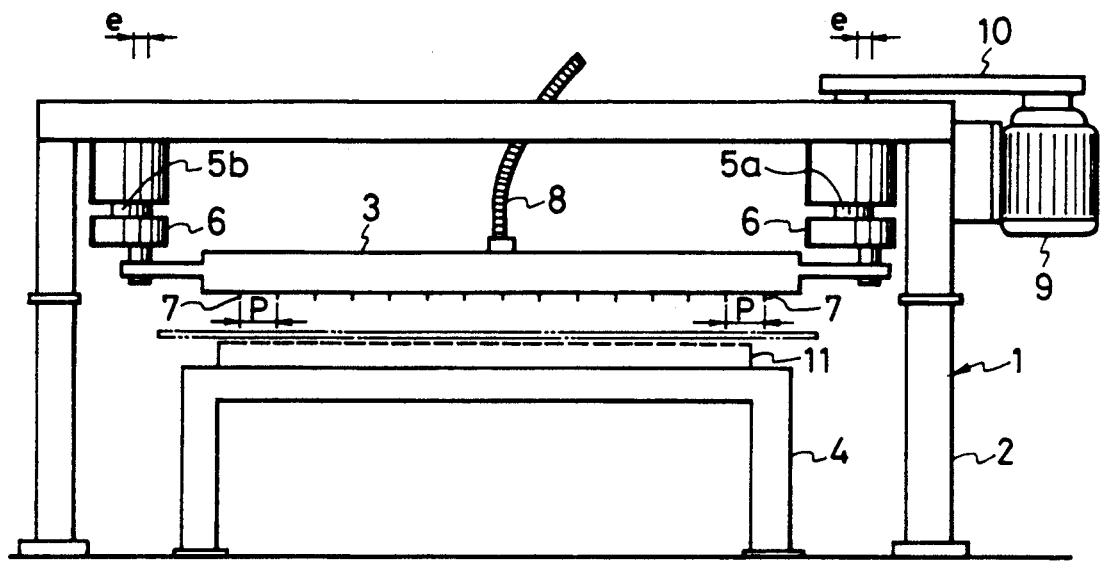
FIGS. 1 and 2 are a front view and a plan view, respectively, showing one embodiment of this invention.
Figure 2:
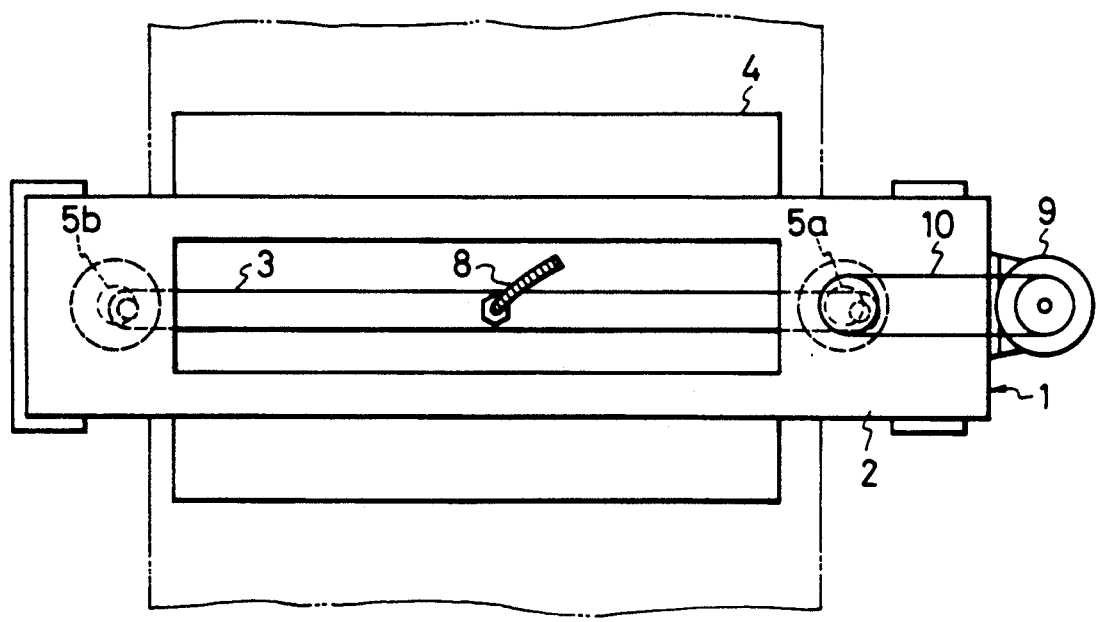

FIGS. 1 and 2 show one embodiment of the invention.

A high pressure fluid processing device 1 according to the invention comprises a frame 2 positioned across a passage for conveying workpieces to be machined, a header 3, and a bed plate 4.

Rotatable shafts 5a and 5b are provided on both sides of the frame 2, respectively. The rotatable shaft 5a is provided on the driving side. The ends of the cranks 6 are coupled to the rotatable shafts 5a and 5b, respectively. The other ends of the cranks 6 are pivotally connected to both ends of the header 3, respectively.

The header 3 has a plurality of nozzles 7 mounted at the intervals P. A flexible hose 8 is connected to the header 3 so that high pressure water is supplied to the header 3 through the flexible hose 8. In FIGS. 1 and 2, reference numeral 9 designates an electric motor for driving the rotatable shaft 5a by the belt 10. Reference numeral 11 designates a receiving stand which is set on the bed plate 4 and well drained.

The high pressure fluid processing device thus constructed is operated as follows: As the shaft 5a is rotated by the motor 9, the crank 6 is turned about the shaft 5a, while the crank 6 coupled to the rotating shaft 5b is also turned; that is, each of the cranks 6 and 6 performs a circular motion whose radius is equal to the length (e) of the crank. Accordingly, each of the nozzles 7 of the header rotates with the radius (e).

When high pressure water is supplied through the flexible hose 8 to the header 3 which is moving in a circle as described above, it is jetted through the plurality of nozzles 7 onto the workpiece (indicated by the two-dot-dash lines in FIGS. 1 and 2) while forming the circular loci with the radius (e) on the workpiece. The plurality of nozzles 7 may be arranged in one line on the header 3, or may be arranged in such a manner that they are staggered at intervals (P). In the case of FIGS. 1 and 2, only one flexible hose 8 is employed; however, a plurality of flexible hoses 8 may be provided as desired.

In the above-described embodiment, high pressure water is employed; however, it may be replaced by aqueous solutions such as surface active agents according to the materials or the purpose of use of workpieces to be processed or organic solvents may be employed as desired.

In the device of the invention, the radius (e) of the circular motion of the nozzles 7 can be readily adjusted by changing the cranks 6 coupled to the rotatable shafts 5a and 5b. That is, workpieces can be processed suitably according to the materials and the purposes of use thereof.

The device of the invention was used to remove burrs from workpieces, which were printed circuit boards 1300 mm in process width and were drilled. In this processing operation, the nozzle interval (P) was set at 20 mm, the circular motion radius (e) at 20 mm, and the speed of the circular motion at 1500 rpm. Furthermore, the nozzle diameter was 0.1 mm, the distance between the printed circuit board and the nozzles was 50 mm, and the water jetting pressure was 2000 kg/cm². Under these conditions, the burrs could be continuously removed from the printed circuit boards with a line speed of 20 m/min. In this case, the flow rate of the high pressure water was 30 l/min.

As is apparent from the above description, according to the invention, in processing wide workpieces with high pressure fluid, the header having the nozzles arranged at equal intervals in the transverse direction is caused to rotate with a predetermined radius, and accordingly the nozzles are also moved on circles having substantially equal radii, so that wide workpieces can be processed easily and uniformly with high pressure fluid. Thus, according to the invention, workpieces can be processed in various ways separately according to the materials and the purposes of use thereof. For example, burrs may be removed from the workpieces, or the workpieces may be cleaned, or the opening or raising of inorganic fiber woven cloth can be performed.

Figure 4:
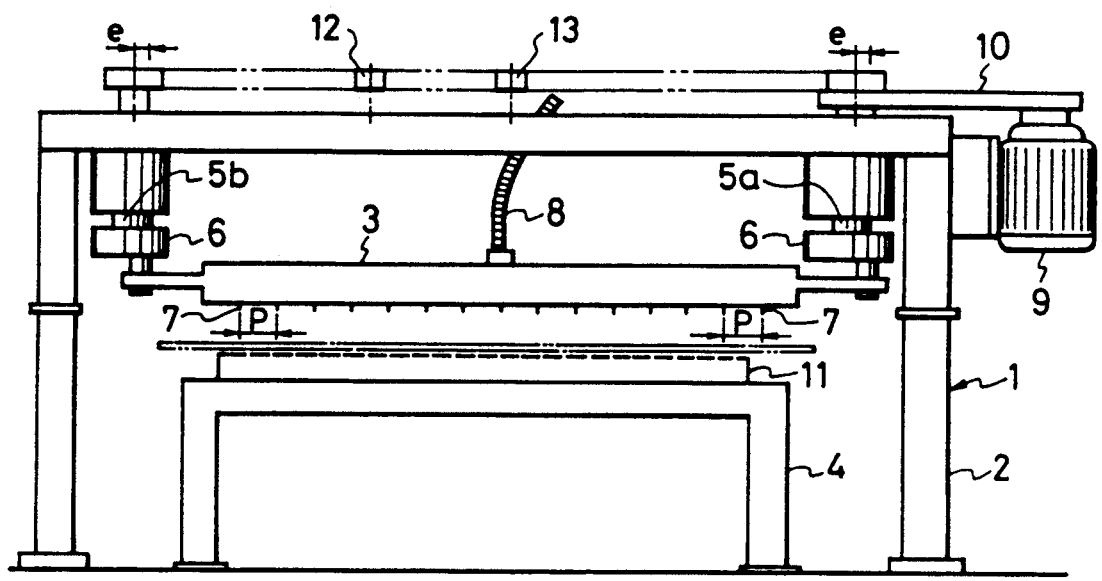
FIGS. 4 and 5 are a front view and a plan view, respectively, showing a modification according to the invention.
Figure 5:
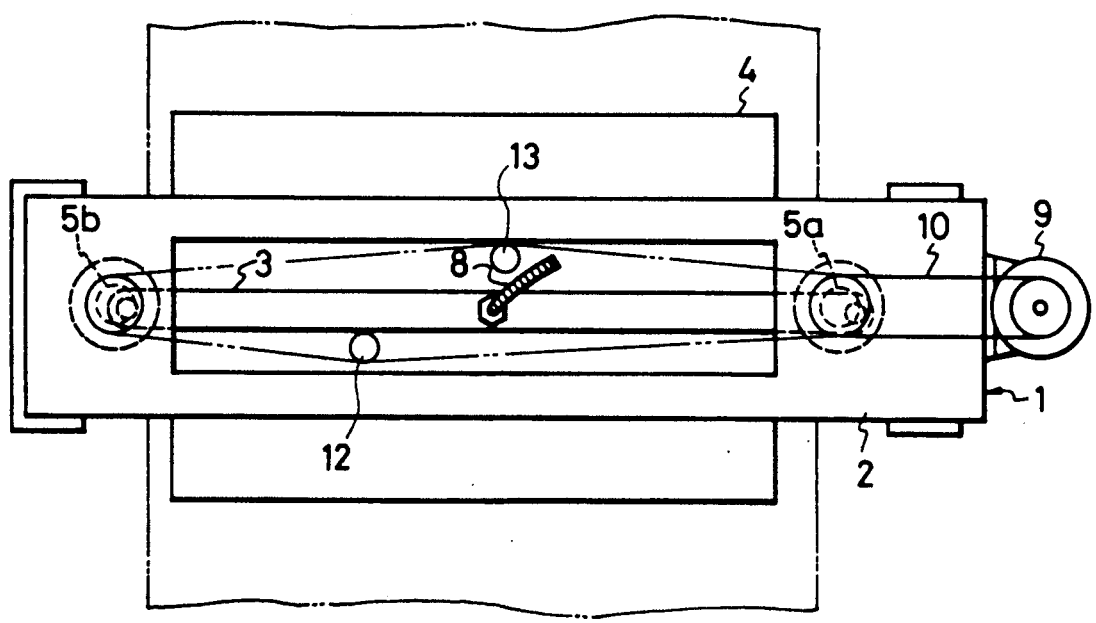

FIGS. 4 and 5 show a modification according to the invention, in which both the rotational shafts 5a and 5b are driven in synchronism with each other by the motor 9. Reference numerals 12 and 13 designate tension pulleys, respectively.

It will be obvious to those skilled in the art that many modifications may be made within the scope of the invention without departing from the spirit thereof, and the invention includes all such modifications.

What is claimed is:

1. A high pressure fluid processing device for removing burrs from molding plastic or processing inorganic fiber woven cloth to be used as a reinforcement material for printed circuit boards or composite material comprising:

means for conveying workpieces to be processed, a frame positioned across said conveying means, a header means having a plurality of nozzles thereon positioned at intervals (P) in the transverse direction of workpieces to be processed for producing a jet flow from said nozzles in a columnar shape, said header having coupling parts being coupled to a driving means for rotation with a radius (e), means for moving said plurality of nozzles in circles at speeds ranging between 100 rpm and 3000 rpm with said radius (e) in accordance with said circular motion of said coupling parts of said header means, and means for forming a locus on the conveyed workpieces by the jet flow jetted from one of said nozzles onto the workpieces in a helical shape so as to generally uniformly apply high pressure fluid stream energy across the surface of each of the workpieces, wherein said radium (e) and said nozzle interval (P) satisfy the equation:

$e \geqq P/2$.

2. A device according to claim 1 in which the nozzle interval (P) is in the range of about 10 to about 20 mm, each nozzle has a diameter of about 0.1 to 0.5 mm, the circular motion radius (e) is in the range of about 10 to 30 mm, and the rotation speed is in the range of about 100 to 3000 rpm.

3. A device according to claim 2 in which fluid jet pressure at the nozzles is in the range of about 50 kg/cm² to 3000 kg/cm².

4. A device according to claim 1 in which said radius (e) and said interval (P) satisfy the equation:

$5P \geqq e \geqq P/2$.

5. A device according to claim 1 in which both of said coupling parts are driven in synchronism with each other.

* * * * *